(12) United States Patent
Shishido et al.

(10) Patent No.: US 12,468,217 B2
(45) Date of Patent: Nov. 11, 2025

(54) MASK BLANK, METHOD OF MANUFACTURING TRANSFER MASK, AND METHOD OF MANUFACTURING SEMICONDUCTOR DEVICE

(71) Applicant: HOYA CORPORATION, Tokyo (JP)

(72) Inventors: Hiroaki Shishido, Tokyo (JP); Osamu Nozawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 558 days.

(21) Appl. No.: 18/010,744

(22) PCT Filed: Jun. 17, 2021

(86) PCT No.: PCT/JP2021/023031
§ 371 (c)(1),
(2) Date: Dec. 15, 2022

(87) PCT Pub. No.: WO2022/014248
PCT Pub. Date: Jan. 20, 2022

(65) Prior Publication Data
US 2023/0259015 A1    Aug. 17, 2023

(30) Foreign Application Priority Data
Jul. 15, 2020   (JP) ................................ 2020-121204

(51) Int. Cl.
*G03F 1/32* (2012.01)
(52) U.S. Cl.
CPC ...................... *G03F 1/32* (2013.01)
(58) Field of Classification Search
CPC ..... G03F 1/32; G03F 1/26; G03F 1/54; G03F 1/58; G03F 1/80
See application file for complete search history.

(56) References Cited

U.S. PATENT DOCUMENTS

2006/0234166 A1   10/2006   Lee et al.
2009/0075185 A1    3/2009   Okubo et al.
(Continued)

FOREIGN PATENT DOCUMENTS

JP    2006303500 A    11/2006
JP    2009069677 A     4/2009
(Continued)

OTHER PUBLICATIONS

PCT/JP2021/023031, "English Translation of International Search Report", Sep. 14, 2021, 3 pages.

*Primary Examiner* — Stewart A Fraser
(74) *Attorney, Agent, or Firm* — Sughrue Mion, PLLC (57) ABSTRACT

Provided is a mask blank.

The mask blank has a structure where a thin film for pattern formation, a first hard mask film, and a second hard mask film are stacked in this order on a main surface of a substrate, the thin film for pattern formation contains a transition metal, the first hard mask film contains oxygen and one or more elements selected from silicon and tantalum, the second hard mask film contains a transition metal, a content of transition metal of the second hard mask film is less than the content of transition metal of the thin film for pattern formation, a region where the first hard mask film is formed on the main surface is smaller than a region where the thin film for pattern formation is formed, and the second hard mask film and the thin film for pattern formation are in contact with each other at least in part.

20 Claims, 3 Drawing Sheets

(56) References Cited

U.S. PATENT DOCUMENTS

| | | | |
|---|---|---|---|
| 2009/0117474 A1 | 5/2009 | Kominato et al. | |
| 2016/0377974 A1* | 12/2016 | Chen | G03F 1/76 430/5 |
| 2017/0153539 A1* | 6/2017 | Tu | H01L 21/0337 |
| 2018/0259842 A1 | 9/2018 | Inazuki et al. | |
| 2018/0259843 A1 | 9/2018 | Fukaya et al. | |

FOREIGN PATENT DOCUMENTS

| | | |
|---|---|---|
| JP | 5348866 B2 | 8/2013 |
| JP | 5393972 B2 | 10/2013 |
| JP | 2018151451 A | 9/2018 |
| JP | 2018151453 A | 9/2018 |
| JP | 2019503082 A | 1/2019 |
| WO | 2017127233 A1 | 7/2017 |

* cited by examiner

MASK BLANK, METHOD OF MANUFACTURING TRANSFER MASK, AND METHOD OF MANUFACTURING SEMICONDUCTOR DEVICE

CROSS-REFERENCE TO RELATED APPLICATIONS

This application is the National Stage of International Application No. PCT/JP2021/023031, filed Jun. 17, 2021, which claims priority to Japanese Patent Application No. 2020-121204, filed Jul. 15, 2020, and the contents of which is incorporated by reference.

TECHNICAL FIELD

The present disclosure relates to a mask blank, a method of manufacturing a transfer mask, and a method of manufacturing a semiconductor device.

BACKGROUND ART

Generally, in the manufacturing process of a semiconductor device, the photolithography method is used to form a fine pattern. Multiple substrates called transfer masks are usually utilized in forming the fine pattern. In order to miniaturize the pattern of the semiconductor device, in addition to miniaturization of a mask pattern formed in a transfer mask, it is necessary to shorten the wavelength of an exposure light source used in photolithography. Recently, shortening of wavelengths has been advancing from the use of a KrF excimer laser (wavelength 248 nm) to an ArF excimer laser (wavelength 193 nm) as an exposure light source in the manufacture of semiconductor devices.

As for the types of transfer masks, a half tone phase shift mask is known in addition to a conventional binary mask having a light shielding pattern formed of a chromium-based material on a transparent substrate. The half tone phase shift mask includes a mask pattern to be formed in a transparent substrate, the mask pattern configured from a portion that transmits light with an intensity that substantially contributes to exposure (light-transmissive portion) and a portion that transmits light with an intensity that substantially does not contribute to exposure (light-semitransmissive portion). The light-semitransmissive portion shifts the phase of light passing therethrough so that the phase of the light passed therethrough is substantially inverted with respect to the phase of the light transmitted through the light-transmissive portion. As a result, the lights transmitted near the boundary between the light-transmissive portion and the light-semitransmissive portion cancel each other to thereby maintain good contrast at the boundary.

As a mask blank for a half tone phase shift mask, a mask blank having a structure where a half tone phase shift film configuring a light-semitransmissive portion, a light-shielding film, and an etching mask film (hard mask film) consisting of an inorganic material are stacked has been known.

Further, in a binary mask, a mask blank having a structure where an etching mask film (hard mask film) is stacked on a light shielding film has been known.

For example, Patent Document 1 discloses a mask blank having a light shielding film, a mask layer containing silicon, and a chromium nitride-based film formed in order on a transparent substrate.

Patent Document 2 discloses a method of manufacturing a mask blank for electron beam writing for forming a resist pattern by electron beam writing, the mask blank having a light shielding film and an etching mask film consisting of an inorganic material having durability to etching of the light shielding film stacked in this order on a transparent substrate, in which, in forming the etching mask film, at least a side surface of the substrate is shielded by a shielding plate so that a film is not formed on the side surface.

PRIOR ART PUBLICATIONS

Patent Documents

[Patent Document 1]
Japan Patent No. 5348866
[Patent Document 2]
Japan Patent No. 5393972

SUMMARY OF THE DISCLOSURE

Problems to be Solved by the Disclosure

In the photolithography technique, the minimum size (resolution) that can be transferred by a projection exposure apparatus is proportional to the wavelength of light used for exposure, and inversely proportional to the numerical aperture (NA) of a lens of the projection optical system, so that the need for miniaturization of semiconductor devices has led to shorter wavelengths of exposure light and higher NA of projection optical system. However, there is a limit to satisfy such needs only by shortening the wavelength and increasing NA.

Therefore, in order to increase resolution, a super-resolution technique has been proposed in recent years to achieve miniaturization by reducing the value of the process constant k1 (k1=resolution line width×numerical aperture of projection optical system/wavelength of exposure light). One of such super-resolution techniques is to optimize a mask pattern by providing an assist pattern or a line width offset to the mask pattern depending on the characteristics of the exposure optical system.

The method using an assist pattern is the lithography method using a transfer mask structured by placing a pattern which is at or below resolution limit of the projection optical system and which is not transferred to a wafer (hereinafter referred to as assist pattern) near a pattern to be transferred onto the wafer (hereinafter referred to as main pattern) so that the transfer mask has an effect to enhance resolution and focus depth of the main pattern. The assist pattern is also referred to as SRAF (Sub Resolution Assist Feature) (hereinafter in the present disclosure, the assist pattern is also referred to as SRAF).

However, in association with miniaturization of semiconductor device patterns, transfer masks having assist patterns have encountered difficulties in manufacturing these masks. First, as mentioned above, the assist pattern itself must not form an image on the wafer and must be smaller in size than the main pattern. As a result, in association with miniaturization of the main pattern size, the expected line width size of the assist pattern is becoming finer from several 100 nm to 40 nm, or even about 20 nm.

However, it has been discovered that with conventional mask blanks, it is difficult to fabricate transfer masks with assist patterns with the size as small as about 20 nm.

The present disclosure was made to solve the conventional problems, and an aspect is to provide a mask blank that can be used to form a transfer mask which has an assist pattern with the size as small as about 20 nm with high precision. Moreover, the present disclosure provides a method of manufacturing a transfer mask in which, by using the mask blank, a precise, fine pattern can be formed in a thin film for pattern formation. Moreover, an aspect of the present disclosure is to provide a method of manufacturing a semiconductor device using a transfer mask manufactured by the method of manufacturing such a transfer mask.

Means for Solving the Problem

For solving the above problem, the present disclosure includes the following configurations.

(Configuration 1)

A mask blank including a structure where a thin film for pattern formation, a first hard mask film, and a second hard mask film are stacked in this order on a main surface of a substrate, in which the thin film for pattern formation contains a transition metal;

in which the first hard mask film contains oxygen and one or more elements selected from silicon and tantalum;

in which the second hard mask film contains a transition metal;

in which a content of transition metal of the second hard mask film is less than a content of transition metal of the thin film for pattern formation;

in which a region where the first hard mask film is formed on the main surface is smaller than a region where the thin film for pattern formation is formed; and in which the second hard mask film and the thin film for pattern formation are in contact with each other at least in part.

(Configuration 2)

The mask blank according to Configuration 1, in which a total content of oxygen and nitrogen of the second hard mask film is greater than a total content of oxygen and nitrogen of the thin film for pattern formation.

(Configuration 3)

The mask blank according to Configuration 1 or 2, in which a region where the second hard mask film is formed on the main surface is greater than the region where the first hard mask film is formed.

(Configuration 4)

The mask blank according to any of Configurations 1 to 3, in which a difference between a content of transition metal of the thin film for pattern formation and a content of transition metal of the second hard mask film is 10 atom % or more.

(Configuration 5)

The mask blank according to any of Configurations 1 to 4, in which a total content of oxygen and nitrogen of the second hard mask film is 30 atom % or more.

(Configuration 6)

The mask blank according to any of Configurations 1 to 5, in which the second hard mask film has a film thickness of 5 nm or less.

(Configuration 7)

The mask blank according to any of Configurations 1 to 6, in which a total content of oxygen and nitrogen of the first hard mask film is 50 atom % or more.

(Configuration 8)

The mask blank according to any of Configurations 1 to 7, in which an oxygen content of the first hard mask film is 50 atom % or more.

(Configuration 9)

The mask blank according to any of Configurations 1 to 8, in which the first hard mask film has a film thickness of 7 nm or more.

(Configuration 10)

The mask blank according to any of Configurations 1 to 9, in which the thin film for pattern formation has a film thickness of 60 nm or less.

(Configuration 11)

The mask blank according to any of Configurations 1 to 10, in which the thin film for pattern formation is a light shielding film, and in which a phase shift film is provided between the substrate and the light shielding film.

(Configuration 12)

The mask blank according to Configuration 11, in which the phase shift film contains silicon.

(Configuration 13)

The mask blank according to Configuration 11 or 12, in which the phase shift film has a function to transmit an exposure light at a transmittance of 1% or more, and a function to generate a phase difference of 150 degrees or more and 210 degrees or less between the exposure light transmitted through the phase shift film and the exposure light transmitted through the air for a same distance as a thickness of the phase shift film.

(Configuration 14)

A method of manufacturing a transfer mask using the mask blank according to any of Configurations 1 to 10, including the steps of:

forming a transfer pattern in the second hard mask film by dry etching using oxygen-containing chlorine-based gas with a resist film having a transfer pattern formed on the second hard mask film as a mask;

forming a transfer pattern in the first hard mask film by dry etching using fluorine-based gas with a second hard mask film having the transfer pattern formed therein as a mask; and forming a transfer pattern in the thin film for pattern formation by dry etching using oxygen-containing chlorine-based gas with a first hard mask film having the transfer pattern formed therein as a mask.

(Configuration 15)

A method of manufacturing a transfer mask using the mask blank according to any of Configurations 11 to 13, including the steps of:

forming a transfer pattern in the second hard mask film by dry etching using oxygen-containing chlorine-based gas with a resist film having a transfer pattern formed on the second hard mask film as a mask;

forming a transfer pattern in the first hard mask film by dry etching using fluorine-based gas with a second hard mask film having the transfer pattern formed therein as a mask;

forming a transfer pattern in the light shielding film by dry etching using oxygen-containing chlorine-based gas with a first hard mask film having the transfer pattern formed therein as a mask; and forming a transfer pattern in the phase shift film by dry etching using fluorine-based gas with a light shielding film having the transfer pattern formed therein as a mask.

(Configuration 16)

A method of manufacturing a semiconductor device including the step of transferring a transfer pattern on a resist film on a semiconductor substrate by exposure using the transfer mask manufactured by the method of manufacturing a transfer mask according to Configuration 14 or 15.

Effect of the Disclosure

According to the mask blank of the present disclosure, a transfer mask having an assist pattern with a size as small as about 20 nm can be formed with high precision. Moreover, with the present disclosure, it is possible to manufacture a transfer mask that can be used to form a precise, fine pattern in a thin film for pattern formation by using the mask blank. Moreover, with the present disclosure, it is possible to provide a method of manufacturing a semiconductor device using a transfer mask manufactured by the method of manufacturing such a transfer mask.

EMBODIMENTS FOR CARRYING OUT THE DISCLOSURE

Before explaining the embodiments of the present disclosure, the background of the present disclosure is explained below.

In forming an assist pattern with about 20 nm line width as described above in a thin film for pattern formation (such as a light shielding film) formed of transition metal materials, it is difficult to form the assist pattern in the thin film for pattern formation by dry etching using a resist pattern of organic materials as a mask. This is because the amount of etching in the film thickness direction of the resist pattern is relatively large during dry etching, and the resist film needs to be thick. In addition, the etching amount in the sidewall direction of the resist pattern (side etching amount) is also relatively large. In general, anticipating the effect of this side etching, a pattern is written by exposure on a resist film with an electron beam by making the line width larger than the actual line width to be formed. A greater amount of side etching makes this adjustment difficult.

To solve these problems, a hard mask film consisting of a silicon-based material can be provided between the thin film for pattern formation and the resist pattern. In this case, the following process is conducted: first, a hard mask pattern is formed by dry etching the hard mask film using a resist pattern as a mask, followed by dry etching a thin film for pattern formation with the hard mask film as a mask to form a thin film pattern. A hard mask film basically has no optical restrictions as required for a thin film for pattern formation. Therefore, a hard mask film can be thinner than a thin film for pattern formation. A resist film only requires a thickness to function as a mask during dry etching for patterning the hard mask film.

The thinner the hard mask film, the thinner the resist film can be. However, during dry etching of the thin film for pattern formation, the hard mask film is also etched, although not as significantly as the thin film for pattern formation. The thinner the hard mask film, the more the verticality tends to be reduced in the sidewall of the pattern of the hard mask film formed by dry etching. During dry etching of the thin film for pattern formation using the hard mask pattern as a mask, the pattern edge portion of the hard mask pattern (ridgeline portion between the top surface and sidewall of the hard mask pattern) is particularly susceptible to etching. When these pattern edge portions are etched and rounded during dry etching, the shape accuracy (LER (Line Edge Roughness), etc.) of the pattern formed in the thin film for pattern formation tends to decrease. As the hard mask film is thinner, the shape accuracy of the pattern formed in the thin film for pattern formation is reduced. In forming an assist pattern with about 20 nm line width in the thin film for pattern formation, the effect of reduction in the pattern shape accuracy is significant. Therefore, the hard mask film requires a thickness at a certain value or more.

Generally, in writing a pattern in a resist film by exposure with an electron beam, it is conducted that an anti-static mechanism such as a ground pin is brought into contact with a thin film under the resist film to allow the electrons charged in the resist film to be released outside. However, the hard mask film of a silicon oxide-based material has poor electric conductivity, and it is difficult to release the electrons in the resist film outside using only the hard mask film. The thin film for pattern formation of transition metal materials has relatively high electric conductivity, and the electrons in the resist film can be released outside from the thin film for pattern formation via the hard mask film. However, as the thickness of the hard mask film increases, it becomes more difficult for the electrons in the resist film to pass through the hard mask film to reach the thin film for pattern formation. Therefore, there is a problem that as the thickness of the hard mask film increases, charge-up is more likely to occur during writing with an electron beam by exposure. On the other hand, in recent years, multi-beam writers using multiple electron guns for writing on the resist film have been developed, and this problem becomes more significant when the multi-beam writer is used to write in the resist film by exposure. These problems also occur when tantalum oxide-based material is used for the hard mask film.

To solve the problem of electric conductivity, consideration was made to further provide a hard mask film of a transition metal material (second hard mask film) on a hard mask film of a silicon oxide-based material or a tantalum-oxide based material (first hard mask film). Generally, an aspect ratio, i.e., ratio of thickness to line width of a resist pattern, is expected to be 1:2 or less. This is to restrain collapse of pattern of the resist film, and it is more important in the case of a fine pattern of 20 nm line width. Namely, the film thickness of the resist pattern is expected to be 40 nm or less. In order to form a pattern in a second hard mask film by dry etching with a resist pattern with such a thin film thickness as a mask, the etching rate of the second hard mask film should be fast. Normally, the more the transition metal content of the second hard mask film, the lower the etching rate tends to be. Also, the more the content of elements which are gaseous at room temperature such as oxygen and nitrogen in the second hard mask film, the faster the etching rate tends to be. Consideration was made to add these elements in order to reduce the transition metal content of the second hard mask film to enhance the etching rate. However, it was found that reducing the transition metal content of the second hard mask film enhances the etching rate, but decreases electric conductivity. In other words, the electric conductivity of such a second hard mask film, although not as much as that of the first hard mask film, was found to be much lower than that of the thin film for pattern formation, making it difficult to sufficiently release the electrons charged in the resist film during electron beam exposure writing.

As a result of diligent consideration to solve these problems, the inventors came up with the idea of electrically connecting the thin film for pattern formation and the second hard mask film.

Namely, the mask blank of the present disclosure has a structure where a thin film for pattern formation, a first hard mask film, and a second hard mask film are stacked in this order on a main surface of a substrate, in which the thin film for pattern formation contains a transition metal, in which the first hard mask film contains oxygen and one or more elements selected from silicon and tantalum, in which the second hard mask film contains a transition metal, the content of transition metal of the second hard mask film is less than the content of transition metal of the thin film for pattern formation, a region where the first hard mask film is formed on the main surface is smaller than a region where the thin film for pattern formation is formed, and the second hard mask film and the thin film for pattern formation are in contact with each other at least in part.

First Embodiment

[Mask Blank and its Manufacture]

The embodiments are explained below with reference to the drawings.

Figure 1:
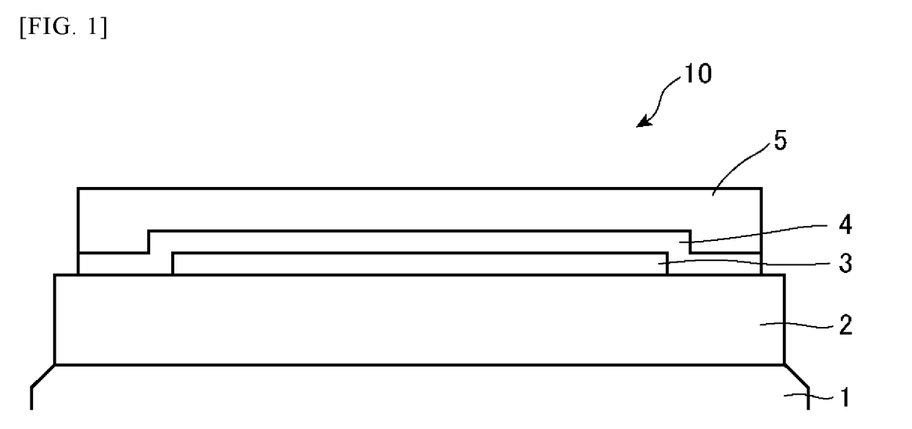
FIG. 1 is a cross-sectional view showing a configuration of the mask blank (binary mask blank) of the first embodiment of the present disclosure.

FIG. 1 is a cross-sectional view showing a configuration of a mask blank (binary mask blank) 10 of the first embodiment of the present disclosure. The mask blank 10 of the present disclosure shown in FIG. 1 has a structure where a light shielding film (thin film for pattern formation) 2, a first hard mask film 3, a second hard mask film 4, and a resist film 5 are stacked in this order on a substrate 1.

The substrate 1 can be formed of quartz glass, aluminosilicate glass, soda-lime glass, low thermal expansion glass ($SiO_2$—$TiO_2$ glass, etc.), or the like, in addition to synthetic quartz glass. Among these materials, synthetic quartz glass is particularly preferable as a material for forming a substrate of a mask blank for having high transmittance to an ArF exposure light and having sufficient rigidity that is unlikely to cause a deformation.

In this embodiment, the first hard mask film 3 and the second hard mask film 4 are stacked on the light shielding film 2. A single layer structure and a stacked structure of two or more layers are applicable to the light shielding film 2, the first hard mask film 3, and the second hard mask film 4. Further, each layer in the single layer structure or the stacked structure can be configured by approximately the same composition in the thickness direction of the film or the layer, or with a composition gradient in the thickness direction of the layer.

The light shielding film 2 is a thin film for pattern formation in which a transfer pattern is formed when a binary mask is manufactured from a mask blank. High light shielding performance is expected in a pattern of the light shielding film 2 in a binary mask. Optical density (OD) of the light shielding film 2 alone to an exposure light is expected to be 2.8 or more, and more preferably OD of 3.0 or more.

The light shielding film 2 is formed of a material that enables patterning of a transfer pattern by dry etching with etching gas containing chlorine-based gas. Examples of materials with such a characteristic include materials containing transition metals. The transition metals to be included in the light shielding film 2 include any one of metals such as molybdenum (Mo), tungsten (W), titanium (Ti), chromium (Cr), nickel (Ni), vanadium (V), zirconium (Zr), ruthenium (Ru), rhodium (Rh), niobium (Nb), and palladium (Pd), or a metal alloy thereof.

The material forming the light shielding film 2 can contain one or more elements selected from oxygen, nitrogen, carbon, boron, and hydrogen within the range of not significantly reducing optical density. To reduce the reflectance to an exposure light on a surface opposite the substrate 1 of the light shielding film 2, a surface layer of the light shielding film opposite the substrate 1 can contain a greater amount of oxygen and/or nitrogen. The silicon content of the light shielding film 2 is preferably 5 atom % or less, more preferably 3 atom % or less, and even more preferably less than or equal to a lower detection limit of a maximum peak of Si2p narrow spectrum obtained by analysis of X-ray photoelectron spectroscopy. The light shielding film 2 is formed by the sputtering method as described below. Therefore, the light shielding film 2 can contain noble gas such as argon (Ar), krypton (Kr), xenon (Xe), helium (He), and neon (Ne).

The light shielding film 2 is preferably formed of a material containing chromium. Examples of materials containing chromium for forming the light shielding film 2 can include, in addition to chromium metal, a material containing chromium (Cr) and one or more elements selected from oxygen (O), nitrogen (N), carbon (C), boron (B), and fluorine (F). While a chromium-based material is generally etched by mixed gas of chlorine-based gas and oxygen gas, an etching rate of a chromium metal to the etching gas is not so high. Considering enhancing an etching rate to etching gas of mixed gas of chlorine-based gas and oxygen gas, a material for forming the light shielding film 2 preferably contains chromium and one or more elements selected from oxygen, nitrogen, carbon, boron, and fluorine. Further, one or more elements among molybdenum, indium, and tin can be included in the material containing chromium for forming the light shielding film 2. Including one or more elements among molybdenum, indium, and tin can further increase an etching rate to mixed gas of chlorine-based gas and oxygen gas.

The film thickness of the light shielding film 2 is preferably 60 nm or less, and more preferably 50 nm or less, in order to form a SRAF pattern of about 20 nm line width with high precision. On the other hand, the film thickness of the light shielding film 2 is preferably 30 nm or more from the viewpoint of securing optical density and securing electric conductivity.

The first hard mask film 3 is formed of a material containing oxygen and one or more elements selected from silicon and tantalum to have etching selectivity to etching gas used in etching the light shielding film 2.

It is preferable to employ $SiO_2$, SiON, etc. as materials containing silicon and oxygen. In this case, the total content of silicon and oxygen of the first hard mask film 3 is preferably 96 atom % or more, and more preferably 98 atom % or more. The total content of silicon, nitrogen, and oxygen of the first hard mask film 3 is preferably 96 atom % or more, and more preferably 98 atom % or more. The first hard mask film 3 formed of a material containing silicon and oxygen can contain a transition metal within the range where sufficient etching selectivity can be obtained with respect to each of the light shielding film 2 and the second hard mask film 4.

Examples of materials containing tantalum and oxygen include materials containing, in addition to tantalum and oxygen, one or more elements selected from nitrogen, boron, and carbon, for example, TaO, TaON, TaBO, TaBON, TaCO, TaCON, TaBOCN, and so on. In this case, among these materials, the first hard mask film 3 preferably contains boron.

The total content of oxygen and nitrogen of the first hard mask film 3 is preferably 50 atom % or more, more preferably 55 atom % or more, and even more preferably 60 atom % or more. The oxygen content of the first hard mask film 3 is preferably 50 atom % or more, more preferably 55 atom % or more, and even more preferably 60 atom % or more. Thus, etching selectivity to etching gas when patterning the light shielding film 2 and the second hard mask film 4 can further be enhanced. On the other hand, the resistance of the first hard mask film 3 becomes higher, which makes it more difficult for the electrons irradiated on the resist film during exposure writing with an electron beam to flow out through the first hard mask film.

The first hard mask film 3 is preferably formed in a region smaller than the region where the light shielding film 2 is formed in plan view (on the main surface of the substrate 1). Such a configuration facilitates the light shielding film 2 and the second hard mask film 4 to be in contact with each other at least in part. The first hard mask film 3 only needs to be large enough to cover the pattern transfer region. For example, the first hard mask film 3 is preferably formed to cover a region including at least a square region with 132 mm side based on the center of the substrate 1.

The film thickness of the first hard mask film 3 is preferably 7 nm or more, and more preferably 12 nm or more, in order to function as a hard mask film that can be used to form a SRAF pattern of about 20 nm line width with high precision on the light shielding film 2 as a thin film for pattern formation. On the other hand, the film thickness of the first hard mask film 3 is preferably 20 nm or less, and more preferably 15 nm or less, in order to form a SRAF pattern of about 20 nm with high precision in the first hard mask film 3 by dry etching with a pattern of the second hard mask film of a relatively less film thickness as a mask, which is described later.

The film density of the first hard mask film 3 is preferably between 1.5 g/cm$^3$ and 9.0 g/cm$^3$. When the film density of the first hard mask film 3 is at the above-described lower limit or more, durability to physical etching action is enhanced when the light shielding film 2 is subjected to dry etching. Particularly, in the case where the first hard mask film 3 is formed of a material containing silicon and oxygen, the film density is preferably between 1.5 g/cm$^3$ and 3.0 g/cm$^3$. On the other hand, in the case where the first hard mask film 3 is formed of a material containing tantalum and oxygen, the film density is preferably between 7.5 g/cm$^3$ and 9.0 g/cm$^3$.

The second hard mask film 4 is stacked on the first hard mask film 3. The second hard mask film 4 needs to have high etching selectivity to etching gas in patterning the first hard mask film 3. From this viewpoint, the second hard mask film 4 preferably contains a transition metal. Examples of transition metals to be included in the second hard mask film 4 include any one of metals such as molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), or a metal alloy thereof. The second hard mask film 4 is preferably formed of a material that can be patterned by dry etching with etching gas containing chlorine-based gas. Further, it is preferable that the light shielding film 2 and the second hard mask film 4 contain the same transition metal for facilitating etching by dry etching using the same etching gas.

The second hard mask film 4 preferably contains at least one of oxygen and nitrogen in view of enhancing etching rate, and more preferably contains oxygen. To increase etching rate compared to that of the light shielding film 2 etc., the total content of oxygen and nitrogen of the second hard mask film 4 is preferably greater than the total content of oxygen and nitrogen of the light shielding film 2. For the same reason, the content of transition metal of the second hard mask film 4 is preferably less than the content of transition metal of the light shielding film 2. Further, the difference between the content of transition metal of the light shielding film 2 and the content of transition metal of the second hard mask film 4 is preferably 10 atom % or more, and more preferably 15 atom % or more. Moreover, the content of transition metal of the second hard mask film 4 is preferably 60 atom % or less, and more preferably 55 atom % or less.

Further, the total content of oxygen and nitrogen of the second hard mask film 4 is preferably 30 atom % or more, and more preferably 32 atom % or more, so that the second hard mask film 4 has etching rate at a certain value or more. The oxygen content of the second hard mask film 4 is preferably 20 atom % or more.

The second hard mask film 4 is preferably formed of a material containing chromium. Examples of materials containing chromium for forming the second hard mask film 4 can include, in addition to chromium metal, materials containing chromium (Cr) and one or more elements selected from oxygen (O), nitrogen (N), carbon (C), boron (B), and fluorine (F). While a chromium-based material is generally etched by mixed gas of chlorine-based gas and oxygen gas, an etching rate of a chromium metal to the etching gas is not so high. Considering enhancing an etching rate to etching gas of mixed gas of chlorine-based gas and oxygen gas, the material forming the second hard mask film 4 preferably contains chromium and one or more elements selected from oxygen, nitrogen, carbon, boron, and fluorine. Further, one or more elements among molybdenum, indium, and tin can be included in the material containing chromium for forming the second hard mask film 4. Including one or more elements among molybdenum, indium, and tin can further increase an etching rate to mixed gas of chlorine-based gas and oxygen gas.

The film thickness of the second hard mask film 4 is preferably 5 nm or less, and more preferably 4 nm or less, in order to form a SRAF pattern of about 20 nm with high precision by dry etching with a resist pattern of 40 nm or less film thickness as a mask. On the other hand, for the pattern of the second hard mask film 4 to function sufficiently as a mask in dry etching to form a pattern in the first hard mask film, the film thickness of the second hard mask film 4 is preferably 2 nm or more.

The region where the second hard mask film 4 is formed on the main surface of the substrate 1 is preferably greater than the region where the first hard mask film 3 is formed. Thus, as mentioned above, since the region where the first hard mask film 3 is formed is smaller than the region where the light shielding film 2 is formed, the second hard mask film 4 and the light shielding film 2 can be formed such that the second hard mask film 4 and the light shielding film 2 are in contact with each other outside the first hard mask film 3, making it possible to secure electric conductivity in the outer peripheral region. It is preferable that the second hard mask film 4 is formed up to a region beyond the outer peripheral edge of the region where the first hard mask film 3 is formed (namely, the first hard mask film 3 is entirely covered with the second hard mask film 4). On the other hand, the second hard mask film 4 can be formed such that a part thereof is formed up to a region beyond the outer peripheral edge of the region where the first hard mask film 3 is formed to be in contact with the light shielding film 2, while other portions are formed in the same region as the region where the first hard mask film 3 is formed.

The film density of the second hard mask film 4 is preferably between 3.5 g/cm$^3$ and 7.0 g/cm$^3$.

In the mask blank 10, a resist film 5 of an organic material is preferably formed with a film thickness of 40 nm or less in contact with a surface of the second hard mask film 4. With such a configuration, even in the case of writing a transfer pattern including a fine assist pattern of about 20 nm, the cross-sectional aspect ratio of the resist pattern can be reduced to 1:2 or more, so that collapse and peeling of the resist pattern can be restrained in developing, rinsing, etc. of the resist film 5.

The light shielding film 2, the first hard mask film 3, and the second hard mask film 4 can each be formed by the reactive sputtering method. As the sputtering method, a sputtering using direct current (DC) power source (DC sputtering), or a sputtering using radio-frequency (RF) power source (RF sputtering) can be used. In addition, the magnetron sputtering method and conventional method can also be used. The DC sputtering method is preferable for having a simple mechanism. The magnetron sputtering method is preferable for increasing the film forming rate and for enhancing productivity. A film-forming apparatus can be an in-line type or a single-wafer type.

Further, in placing the substrate 1 on a rotation stage in a film-forming apparatus to form the light shielding film 2, the first hard mask film 3, and the second hard mask film 4, by placing a mask shield on or above the main surface of the substrate 1 to adjust the opening region of the mask shield, the film forming region on the main surface of the substrate 1 of each film can be adjusted to be in a desired region.

Further, the resist film 5 is formed by the spin coating method.

While the configuration of the mask blank 10 of this embodiment was explained referring to FIG. 1, the configuration is not limited thereto, but the mask blank can be configured, for example, with a charge dissipation layer (CDL) on a surface layer of the resist film 5, or can be configured without the resist film 5.

[Method of Manufacturing Transfer Mask (Binary Mask)]

Explanation is made using FIGS. 3A-3D on the method of manufacturing a transfer mask (binary mask) using the mask blank 10 of the first embodiment.

Figure 3A:
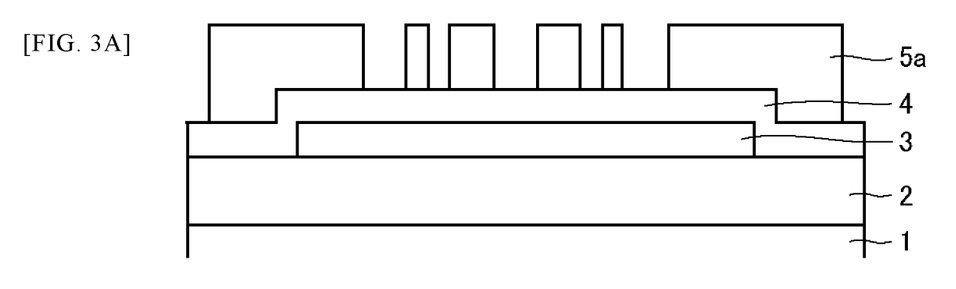
FIGS. 3A-3D are cross-sectional views showing a configuration of the transfer mask (binary mask) of the first embodiment of the present disclosure.

A first pattern to be formed in the light shielding film 2 is written with an electron beam on the resist film 5 with a film thickness of 40 nm or less formed by the spin coating method in the mask blank 10 shown in FIG. 1, and predetermined treatments such as developing are further conducted to thereby form a resist film (resist pattern) 5a having a first pattern (see FIG. 3A). The first pattern includes an assist pattern of about 20 nm line width, in addition to the pattern to be transferred to the semiconductor device (main pattern).

At this stage, a ground pin (not shown) is in contact with a predetermined region where the second hard mask film 4 and the light shielding film 2 are in contact with each other outside the first hard mask film 3, and a ground is secured between the resist film 5, the second hard mask film 4, and the light shielding film 2. Therefore, charge-up in writing an electron beam on the resist film can be restrained, and an exposure writing with high positional precision can be made.

Subsequently, dry etching using mixed gas of chlorine-based gas and oxygen-based gas is conducted on the second hard mask film 4 with the resist pattern 5a as a mask, and a second hard mask film (hard mask pattern) 4a (see FIG. 3B) having a first pattern is formed. Thereafter, the resist pattern 5a is removed.

Figure 3B:
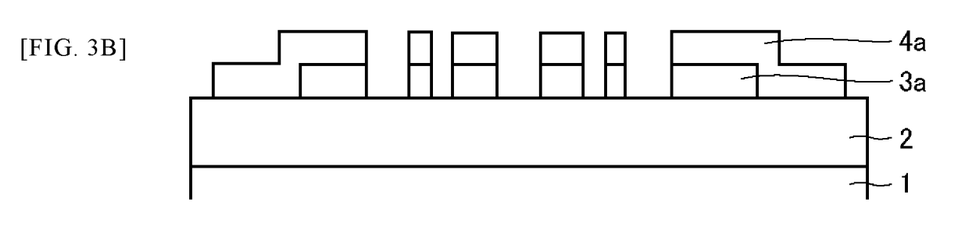
Figure 3C:
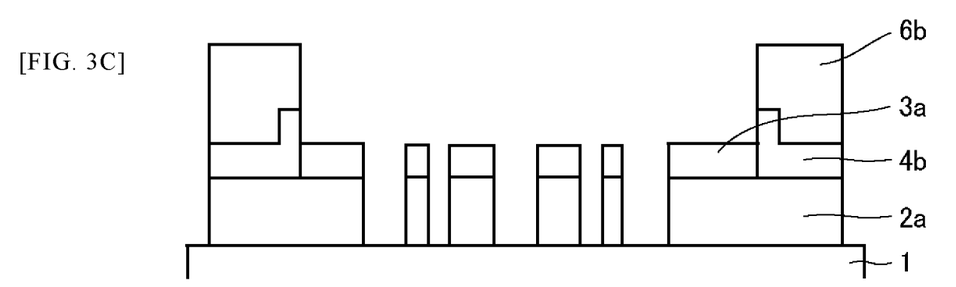
Figure 3D:
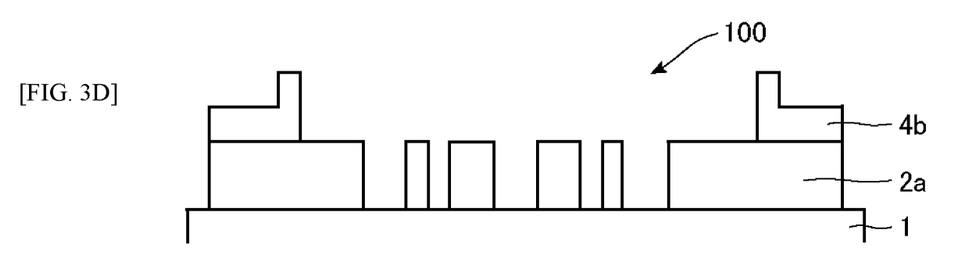

Next, dry etching using fluorine-based gas is conducted on the first hard mask film 3 with the second hard mask pattern 4a as a mask, and a first hard mask film (first hard mask pattern) 3a (see FIG. 3B) having a first pattern is formed. Subsequently, another resist film is formed by the spin coating method. Thereafter, a laser writing is conducted on the resist film in a range where the first hard mask pattern 3a is formed, predetermined treatments such as developing are further conducted to thereby form a resist film (resist pattern) 6b having a second pattern (see FIG. 3C) (at this stage, the light shielding film 2 remains as shown in FIG. 3B). Thereafter, dry etching is conducted on the light shielding film 2 using mixed gas of chlorine-based gas and oxygen gas with the first hard mask pattern 3a and the resist pattern 6b as masks, and a light shielding film (light shielding pattern) 2a having a first pattern is formed (see FIG. 3C). At this stage, the exposed portion of the second hard mask pattern 4a is removed by dry etching, and a second hard mask film (second hard mask pattern) 4b having a second pattern is formed (see FIG. 3C).

Subsequently, dry etching using fluorine-based gas is conducted on the first hard mask pattern 3a with the resist pattern 6b and the second hard mask pattern 4b as masks, and the first hard mask pattern 3a is removed. Further, the resist pattern 6b is removed, a cleaning step is conducted to thereby manufacture a transfer mask (binary mask) 100 (see FIG. 3D).

[Manufacture of Semiconductor Device]

In the method of manufacturing a semiconductor device of the first embodiment, a transfer pattern is transferred to a resist film on a semiconductor substrate by exposure using the binary mask (transfer mask) 100 of the first embodiment or the binary mask 100 manufactured by using the mask blank 10 of the first embodiment. Therefore, when a transfer is made on a resist film on a semiconductor device by exposure using the binary mask 100 of the first embodiment, a pattern can be formed in the resist film on the semiconductor device with precision sufficiently satisfying the design specification.

Second Embodiment

[Mask Blank and its Manufacture]

Figure 2:
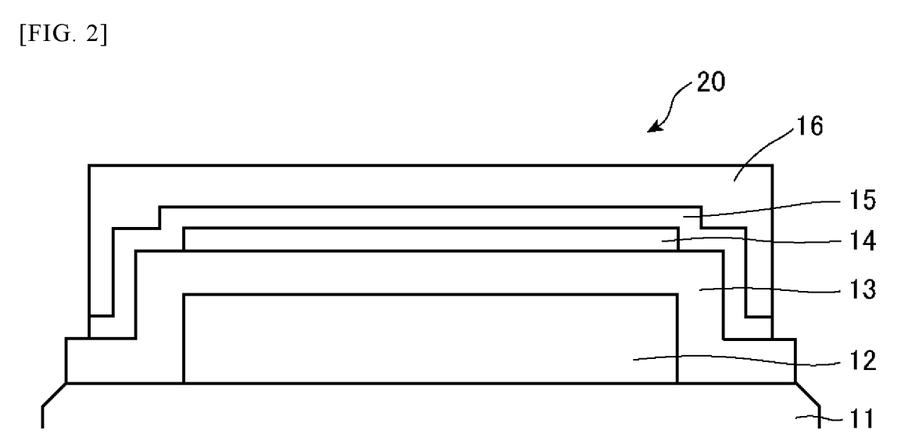
FIG. 2 is a cross-sectional view showing a configuration of the mask blank (phase shift mask blank) of the second embodiment of the present disclosure.

A mask blank of the second embodiment of the present disclosure includes a phase shift film between a substrate and a light shielding film, which is used for manufacturing a phase shift mask (transfer mask). FIG. 2 shows a configuration of the mask blank of the second embodiment. A mask blank 20 of the second embodiment has a phase shift film 12, a light shielding film (thin film for pattern formation) 13, a first hard mask film 14, a second hard mask film 15, and a resist film 16 on a main surface of a substrate 11. The substrate 11 and the resist film 16 are the same as those of the first embodiment, and therefore, their explanations have been omitted.

The phase shift film 12 is formed of a material that can be patterned by dry etching using fluorine-based gas as etching gas, specifically, a material containing silicon. The phase shift film 12 preferably has a function to transmit an exposure light at a transmittance of 1% or more (transmittance) and a function to generate a phase difference of 150 degrees or more and 210 degrees or less between an exposure light transmitted through the phase shift film and the exposure light transmitted through the air by the same distance as the thickness of the phase shift film. The transmittance of the phase shift film 12 is more preferably 2% or more. The transmittance of the phase shift film 12 is more preferably 30% or less, and even more preferably 20% or less.

The phase shift film 12 is preferably formed of a material containing nitrogen (N), in addition to silicon. When the phase shift film 12 can be patterned by dry etching using fluorine-based gas, the phase shift film 12 can further contain one or more elements selected from metalloid elements, non-metallic elements, and metal elements. Among the above, the metalloid elements can be any metalloid elements in addition to silicon. Non-metallic elements can be any non-metallic elements in addition to nitrogen, preferably containing one or more elements selected from, for example, oxygen (O), carbon (C), fluorine (F), and hydrogen (H). Examples of metal elements include molybdenum (Mo), tungsten (W), titanium (Ti), tantalum (Ta), zirconium (Zr), hafnium (Hf), niobium (Nb), vanadium (V), cobalt (Co), chromium (Cr), nickel (Ni), ruthenium (Ru), tin (Sn), boron (B), and germanium (Ge).

The film thickness of the phase shift film 12 is preferably 80 nm or less, and more preferably 70 nm or less. The film thickness of the phase shift film 12 is preferably 50 nm or more. This is because 50 nm or more thickness is required to form the phase shift film 12 with an amorphous material while achieving a phase difference of the phase shift film 12 of 150 degrees or more. A single layer structure and a stacked structure of two or more layers are applicable to the phase shift film 12. Further, each layer in the single layer structure or the stacked structure can be configured by approximately the same composition in the thickness direction of the film or the layer, or with a composition gradient in the thickness direction of the layer.

The phase shift film 12 is preferably formed in a region smaller than the region where the light shielding film 13 is formed, in plan view (on the main surface of the substrate 1). The region where the phase shift film 12 is formed is expected to have a size including at least the pattern transfer region. For example, the phase shift film 12 is preferably formed to cover a region including at least a square region with a 132 mm side based on the center of the main surface of the substrate 11.

For the phase shift film 12 to satisfy the conditions regarding the optical characteristics and film thickness mentioned above, the refractive index n of the phase shift film to an exposure light (ArF exposure light) is preferably 1.9 or more, and more preferably 2.0 or more. Further, the refractive index n of the phase shift film 12 is preferably 3.1 or less, and more preferably 2.7 or less. The extinction coefficient k of the phase shift film 12 to an ArF exposure light is preferably 0.26 or more, and more preferably 0.29 or more. Further, the extinction coefficient k of the phase shift film 12 is preferably 0.62 or less, and more preferably 0.54 or less.

The refractive index n and the extinction coefficient k of a thin film including the phase shift film 12 are not determined only by the composition of the thin film. Film density, crystal condition, and the like of the thin film are also the factors that affect the refractive index n and extinction coefficient k. Therefore, the conditions in forming a thin film by reactive sputtering are adjusted so that the thin film has desired refractive index n and extinction coefficient k. For allowing the phase shift film 12 to have the refractive index n and the extinction coefficient k within the above range, not only adjusting a ratio of mixed gas of noble gas and reactive gas (oxygen gas, nitrogen gas, etc.) is effective in forming a film by reactive sputtering, but various other adjustments are made during forming a film by reactive sputtering, such as pressure in a film-forming chamber, power applied to the sputtering target, and positional relationship such as distance between the target and the substrate 11. Further, these film forming conditions are unique to film-forming apparatuses and are adjusted accordingly so that the phase shift film 12 to be formed has desired refractive index n and extinction coefficient k.

The mask blank 20 has a light shielding film 13 on the phase shift film 12. For the light shielding film 13 of this configuration, it is necessary to apply a material having a sufficient etching selectivity to etching gas used in forming a pattern in the phase shift film 12.

In the light shielding film 13 of this case as well, the same light shielding film 2 explained in the first embodiment is applicable. However, as will be mentioned below, OD up to a degree of the light shielding film 2 for a binary mask is not required in the case of the light shielding film 13 to be provided on the phase shift film 12. Therefore, the film thickness of the light shielding film 13 is preferably 50 nm or less, and more preferably 45 nm or less. On the other hand, the film thickness of the light shielding film 13 is preferably 20 nm or more from the viewpoint of securing optical density and securing electric conductivity.

The light shielding film 13 forms a light shielding band, etc. in the stacked structure with the phase shift film 12 after completion of the phase shift mask. Therefore, the light shielding film 13 is expected to ensure an optical density (OD) greater than 2.0, preferably 2.8 or more OD, and further preferably 3.0 or more OD in the stacked structure with the phase shift film 12.

The first hard mask film 14 is formed on the light shielding film 13. The first hard mask film 14 is formed of a material containing oxygen and one or more elements selected from silicon and tantalum to have etching selectivity to etching gas used in etching the light shielding film 13. Specific material and film thickness are the same as those of the first hard mask film 3 of the first embodiment.

The first hard mask film 14 is preferably formed in a region smaller than the region where the light shielding film 13 is formed, in plan view (on the main surface of the substrate 1). Such a configuration facilitates the light shielding film 13 and the second hard mask film 15 to be in contact with each other at least in part. The first hard mask film 14 only needs to be large enough to cover the pattern transfer region where the phase shift film 12 is formed. For example, the first hard mask film 14 is preferably formed to cover a region at least including a square region with a 132 mm side based on the center of the main surface of the substrate 11.

The second hard mask film 15 is stacked on the first hard mask film 14. The second hard mask film 15 needs to have high etching selectivity to etching gas in patterning the first hard mask film 14. From this viewpoint, the second hard mask film 15 preferably contains a transition metal. Specific material and film thickness are the same as those of the second hard mask film 4 of the first embodiment.

The region where the second hard mask film 15 on the main surface of the substrate 11 is formed is preferably greater than the region where the first hard mask film 14 is formed. Thus, as mentioned above, since the region where the first hard mask film 14 is formed is smaller than the region where the light shielding film 13 is formed, the second hard mask film 15 and the light shielding film 13 can be formed such that the second hard mask film 15 and the light shielding film 13 are in contact with each other outside the first hard mask film 14, making it possible to secure electric conductivity in the outer peripheral region.

It is preferable that the second hard mask film 15 is formed up to a region beyond the outer peripheral edge of the region where the first hard mask film 14 is formed (namely, the first hard mask film 14 is entirely covered with the second hard mask film 15). On the other hand, the second hard mask film 15 can be formed such that a part thereof is formed up to the region beyond the outer peripheral edge of the region where the first hard mask film 14 is formed to be in contact with the light shielding film 13, while other portions are formed in the same region as the region where the first hard mask film 14 is formed.

The phase shift film 12, the light shielding film 13, the first hard mask film 14, and the second hard mask film 15 can each be formed by the reactive sputtering method, in the same manner as in the first embodiment.

Further, in forming the phase shift film 12, the light shielding film 13, the first hard mask film 14, and the second hard mask film 15, by adjusting the opening region of the mask shield, the film forming region of each film can be adjusted to be in a desired region.

Further, the resist film 16 is formed by the spin coating method.

[Method of Manufacturing Transfer Mask (Phase Shift Mask)]

Explanation is made using FIGS. 4A-4F of a method of manufacturing a transfer mask (phase shift mask) using the mask blank 20 of the second embodiment.

Figure 4A:
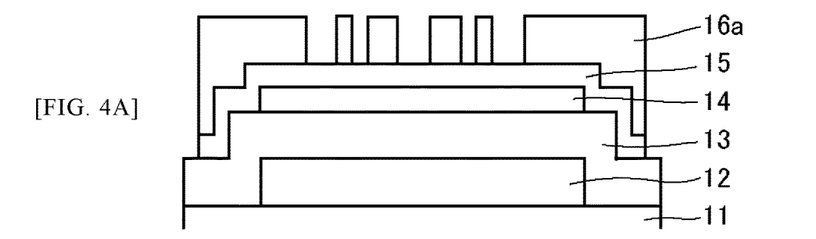
FIGS. 4A-4F are schematic cross-sectional views showing a manufacturing process of the transfer mask (phase shift mask) of the second embodiment of the present disclosure.

A first pattern to be formed in the phase shift film 12 is written with an electron beam on the resist film 16 having a film thickness of 40 nm or less formed in the mask blank 20 shown in FIG. 2 by the spin coating method, and predetermined treatments such as developing are further conducted to thereby form a resist film (resist pattern) 16a having a first pattern (see FIG. 4A). The first pattern includes an assist pattern of about 20 nm line width, in addition to the pattern to be transferred to the semiconductor device (main pattern).

At this stage, a ground pin (not shown) is in contact with a predetermined region where the second hard mask film 15 and the light shielding film 13 are in contact with each other outside the first hard mask film 14, and a ground is secured between the resist film 16, the second hard mask film 15, and the light shielding film 13. Therefore, charge-up in writing with an electron beam on the resist film 16 can be restrained, and an exposure writing with high positional precision can be made (in forming the resist patterns 17b, 18c described below, charge-up can be restrained similarly, and an exposure writing with high positional precision can be made).

Subsequently, dry etching using mixed gas of chlorine-based gas and oxygen-based gas is conducted on the second hard mask film 15 with the resist pattern 16a as a mask, and a second hard mask film (hard mask pattern) 15a having a first pattern (see FIG. 4B) is formed. Thereafter, the resist pattern 16a is removed.

Figure 4B:
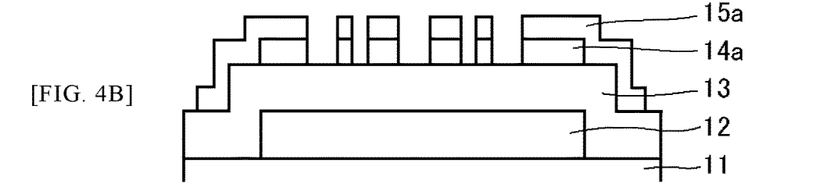

Next, dry etching using fluorine-based gas is conducted on the first hard mask film 14 with the second hard mask pattern 15a as a mask, and a first hard mask film (first hard mask pattern) 14a having a first pattern is formed (see FIG. 4B). Subsequently, another resist film is formed by the spin coating method. Thereafter, a laser writing is conducted on the resist film in a range where the first hard mask pattern 14a is formed, predetermined treatments such as developing are further conducted to thereby form a resist film (resist pattern) 17b having a second pattern (see FIG. 4C) (at this stage, the light shielding film 13 and the second hard mask pattern 15a remain as shown in FIG. 4B). Thereafter, dry etching is conducted on the light shielding film 13 using mixed gas of chlorine-based gas and oxygen gas with the first hard mask pattern 14a and the resist pattern 17b as masks, and a light shielding film (light shielding pattern) 13a having a first pattern is formed (see FIG. 4C). At this stage, the exposed portion of the second hard mask pattern 15a is removed by dry etching, and a second hard mask film (second hard mask pattern) 15b having a second pattern is formed (see FIG. 4C).

Subsequently, dry etching is conducted on the phase shift film 12 using fluorine-based gas with the light shielding pattern 13a as a mask, and a phase shift film (phase shift pattern) 12a having a first pattern is formed (see FIG. 4D). At this stage, the first hard mask pattern 14a is removed (see FIG. 4D).

Next, the resist pattern 17b is removed, a cleaning step is conducted, and another resist film is formed by the spin coating method. Thereafter, a third pattern to be formed in the light shielding film 13 is written with an electron beam on the resist film, and predetermined treatments such as developing are further conducted to thereby form a resist film (resist pattern) 18c having a third pattern (see FIG. 4E). Next, dry etching is conducted on the light shielding film 13 using mixed gas of chlorine-based gas and oxygen gas with the resist pattern 18c as a mask, and a light shielding film (light shielding pattern) 13c having a third pattern is formed. Further, the resist pattern 18c is removed, a cleaning step is conducted to thereby manufacture a transfer mask (phase shift mask) 200 (see FIG. 4F).

[Manufacture of Semiconductor Device]

In the method of manufacturing a semiconductor device of the second embodiment, a transfer pattern is transferred to a resist film on a semiconductor substrate by exposure using the phase shift mask 200 of the second embodiment or the phase shift mask 200 manufactured by using the mask blank 20 of the second embodiment. Therefore, when an exposure transfer is made on a resist film on a semiconductor device using the phase shift mask 200 of the second embodiment, a pattern can be formed in the resist film on the semiconductor device at precision sufficiently satisfying the design specification.

Further, the mask blank of the present disclosure can be a reflective mask blank used for manufacturing a reflective mask for EUV lithography (Extreme Ultraviolet Lithography). In this case, an absorber film is preferably configured from the thin film for pattern formation described above.

In the case of the reflective mask blank, it is preferable to apply a low-thermal expansion glass ($SiO_2$—$TiO_2$ glass, etc.) as the substrate. Further, a preferable configuration is that a multilayer reflective film, a protective film, an absorber film (thin film for pattern formation), a first hard mask film, and a second hard mask film are stacked in this order on the substrate. The configurations of the absorber film, the first hard mask film, and the second hard mask film are preferably the same as the configurations shown in each embodiment given above. The absorber film is preferably formed of the material containing chromium given above. On the other hand, a material containing ruthenium can be used for the absorber film. Examples of materials containing ruthenium in this case include a single metal of ruthenium, and a material containing ruthenium and at least any of nitrogen and oxygen.

A multilayer reflective film provides a function of reflecting EUV light in a reflective mask. The multilayer reflective film is a multilayer film in which layers respectively containing elements having different refractive indices as main components are stacked in cycles. Generally, a multilayer film in which a thin film of a non-heavy element or a compound thereof as a high refractive index material (high refractive index layer) and a thin film of a heavy element or a compound thereof as a low refractive index material (low refractive index layer) are alternately stacked for about 40 to 60 cycles (pair) is used as the multilayer reflective film.

For example, a material containing silicon (Si) can be employed as the high refractive index layer. The Si-containing material can contain silicon alone, and can also be a Si compound containing silicon and at least one element selected from boron (B), carbon (C), zirconium (Zr), nitrogen (N), and oxygen (O). As the low refractive index layer, for example, at least one single metal selected from molybdenum (Mo), ruthenium (Ru), rhodium (Rh), and platinum (Pt), or an alloy thereof can be used. For example, as the multilayer reflective film for reflecting EUV light having a wavelength of 13 nm to 14 nm, a Mo/Si cyclic stacked film in which a layer containing Mo and a layer containing Si are alternately stacked for about 40 to 60 cycles is preferably used.

The protective film 3 can be formed of a silicon-based material, such as silicon (Si), a material containing silicon (Si) and oxygen (O), a material containing silicon (Si) and nitrogen (N), and a material containing silicon (Si), oxygen (O), and nitrogen (N). In the case where the absorber film is formed of a material containing ruthenium, the protective film can be formed of a material selected from chromium (Cr), or a chromium-based material containing chromium (Cr) and at least one or more elements including oxygen (O), nitrogen (N), and carbon (C). On the other hand, a material containing ruthenium can be used for the protective film, depending on the material configuring the absorber film. Examples of materials containing ruthenium include a single metal of Ru, a Ru alloy containing Ru and at least one metal selected from titanium (Ti), niobium (Nb), molybdenum (Mo), zirconium (Zr), yttrium (Y), boron (B), lanthanum (La), cobalt (Co), rhenium (Re), and rhodium (Rh), and a material containing nitrogen therein.

EXAMPLES

The embodiment of the present disclosure is described in greater detail below together with examples.

Example 1

[Manufacture of Mask Blank]

In view of FIG. 2, a substrate 11 made of a synthetic quartz glass with a size of main surfaces of about 152 mm×about 152 mm and the thickness of about 6.35 mm was prepared. The main surfaces of the substrate 11 were polished to a predetermined surface roughness (0.2 nm or less Rq), and thereafter subjected to a predetermined cleaning and drying treatment.

Next, the substrate 11 was placed in a single-wafer DC sputtering apparatus, and by reactive sputtering (DC sputtering) using a mix-sintered target of molybdenum (Mo) and silicon (Si) (Mo:Si=11 atom %:89 atom %) and with mixed gas of argon (Ar), nitrogen ($N_2$), and helium (He) as sputtering gas, a phase shift film 12 formed of molybdenum, silicon, and nitrogen was formed with a thickness of 69 nm on the substrate 11. A masking plate was used in sputtering for forming the phase shift film 12. The masking plate used herein has a square opening having a 146 mm side based on the center of the substrate (i.e., the design region is a square region having a 146 mm side).

Next, the substrate 11 having the phase shift film 12 formed thereon was subjected to heat treatment for reducing film stress of the phase shift film 12 and for forming an oxidization layer at the surface layer. Specifically, the heat treatment was conducted using a heating furnace (electric furnace) at a heating temperature of 450° C. in the atmosphere for one hour. The transmittance and phase difference of the phase shift film 12 after the heat treatment with respect to a light of 193 nm wavelength were measured using a phase shift measurement apparatus (MPM193 manufactured by Lasertec), and the transmittance was 6.0% and the phase difference was 177.0 degrees.

Next, the substrate 11 having the phase shift film 12 formed thereon was placed in a single-wafer DC sputtering apparatus, and reactive sputtering (DC sputtering) was conducted using a chromium (Cr) target under a mixed gas atmosphere of argon (Ar), carbon dioxide ($CO_2$), and helium (He). Thus, a light shielding film consisting of chromium, oxygen, and carbon (CrOC film Cr:O:C=70.4 atom %:15.4 atom %:14.2 atom %) 13 was formed with a film thickness of 36 nm in contact with the phase shift film 12. A masking plate was used as well in sputtering for forming the light shielding film 13. However, the masking plate used herein has a square opening having a 150 mm side based on the center of the substrate (i.e., the design region is a square region having a 150 mm side). The size of one side of the main surfaces of the substrate 11 is 151.2 mm, having significantly small tolerance with the design region.

Next, the substrate 11 having the light shielding film (CrOC film) 13 formed thereon was subjected to heat treatment. Specifically, the heat treatment was conducted using a hot plate at a heating temperature of 280° C. in the atmosphere for five minutes. After the heat treatment, a spectrophotometer (Cary4000 manufactured by Agilent Technologies) was used on the substrate 11 having the phase shift film 12 and the light shielding film 13 stacked thereon to measure optical density of the stacked structure of the phase shift film 12 and the light shielding film 13 with respect to an ArF excimer laser light wavelength (about 193 nm), confirming the value of 3.0 or more.

Next, the first hard mask film 14 ($SiO_2$ film Si:O=33.8 atom %:66.2 atom %) was formed with a thickness of 12 nm on the light shielding film 13. Specifically, the first hard mask film 14 was formed by placing the substrate 11 having the phase shift film 12 and the light shielding film 13 stacked thereon in a single-wafer DC sputtering apparatus, and by DC sputtering using a silicon (Si) target with argon (Ar) gas and oxygen ($O_2$) gas as sputtering gas. A masking plate was used in sputtering for forming the first hard mask film 14. The masking plate used herein has a square opening having a 146 mm side based on the center of the substrate (i.e., the design region is a square region having a 146 mm side).

The first hard mask film 14 was formed with a thickness of 12 nm on another substrate and the film density was measured, and the value was 1.8 g/cm$^3$. The sheet resistance was measured, and the value was 40 kΩ.

Next, a second hard mask film 15 (CrOCN film Cr:54.7 atom %, 0:22.2 atom %, C:11.9 atom %, N:11.2 atom %) was formed with a thickness of 3 nm on the first hard mask film 14. Specifically, a substrate 11 having a phase shift film 12, a light shielding film 13, and a first hard mask film 14 stacked thereon was placed in a single-wafer DC sputtering apparatus, and reactive sputtering (DC sputtering) was conducted using a chromium (Cr) target under a mixed gas atmosphere of argon (Ar), carbon dioxide ($CO_2$), nitrogen ($N_2$), and helium (He). A masking plate was used in sputtering for forming the second hard mask film 15. The masking plate used herein has a square opening having a 148 mm side based on the center of the substrate (i.e., the design region is a square region having a 148 mm side).

A second hard mask film was formed with a thickness of 3 nm on another substrate and the film density was measured, and the value was 4.9 g/cm³. The sheet resistance was measured, and the value was 200 kΩ.

Further, a predetermined cleaning treatment was conducted, a resist film 16 was formed with a film thickness of 40 nm by the spin coating method, and a mask blank 20 of Example 1 was manufactured.

[Manufacture of Transfer Mask (Phase Shift Mask)]

Next, a half tone phase shift mask 200 of Example 1 was manufactured by the above procedure using the mask blank 20 of Example 1 and in view of FIGS. 4A-4F.

More specifically, mixed gas of chlorine gas ($Cl_2$) and oxygen gas ($O_2$) (gas flow ratio $Cl_2:O_2=15:1$) was used for etching the second hard mask film 15, and a second hard mask pattern 15a was formed (see FIG. 4B).

$CF_4$ gas was used as fluorine-based gas for etching the first hard mask film 14, and a first hard mask pattern 14a was formed (see FIG. 4B).

Figure 4C:
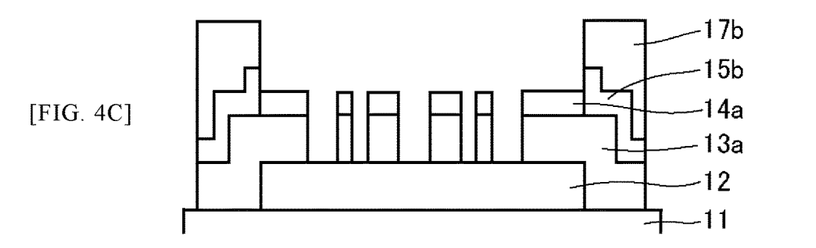
Figure 4D:
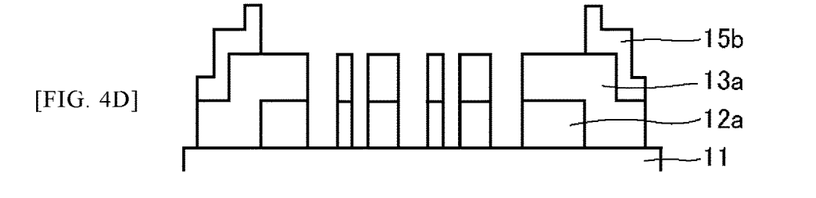
Figure 4E:
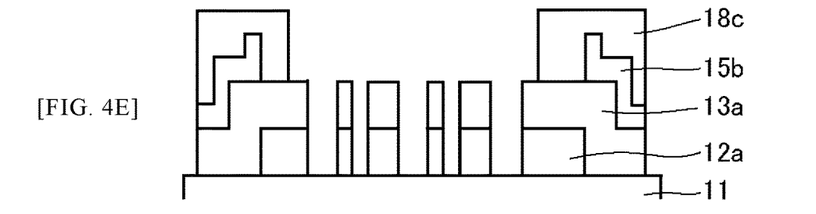
Figure 4F:
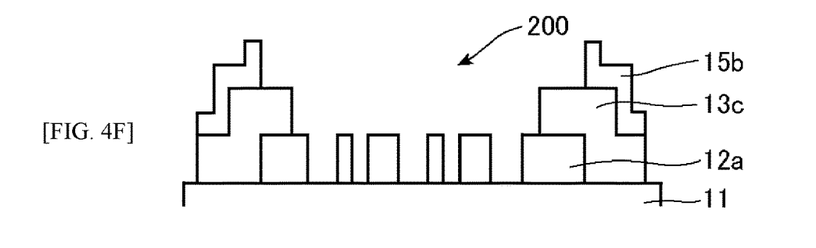

Mixed gas of chlorine gas ($Cl_2$) and oxygen gas ($O_2$) (gas flow ratio $Cl_2:O_2=15:1$) was used for etching the light shielding film 13, and light shielding patterns 13a, 13c were formed (FIG. 4C, FIG. 4D).

$SF_4$ gas was used as fluorine-based gas for etching the phase shift film 12, and a phase shift pattern 12a was formed (see FIG. 4B).

In the series of these steps, a multi-beam writer having two electronic guns was used in electron beam writing, and a ground pin (not shown) was in contact with a predetermined region where the second hard mask film 15 and the light shielding film 13 are in contact with each other outside the first hard mask film 14. Thus, each resist film was written by an electron beam on a predetermined position, and desired resist patterns 16a, 17b, 18c were formed. The resist pattern 16a included a fine SRAF pattern with 20 nm line width, in addition to the main pattern for transfer.

Length measurement of the pattern was conducted on the phase shift mask 200 of Example 1 mainly in the region where the SRAF pattern with 20 nm line width is formed using a length measurement SEM (CD-SEM: Critical Dimension-Scanning Electron Microscope). As a result, a phase shift pattern was formed to have not only the main pattern for transfer, but also the fine SRAF pattern with 20 nm line width with an excellent LER.

On the phase shift mask 200 manufactured by the above procedure, a simulation of a transfer image was made using AIMS193 (manufactured by Carl Zeiss) assuming that an exposure transfer was made on a resist film on a semiconductor device at an exposure light of 193 nm wavelength. The simulated exposure transfer image was inspected, and the design specification was fully satisfied. It can be considered from this result that a circuit pattern to be finally formed on the semiconductor device can be formed at high precision when the phase shift mask 200 of Example 1 is set on a mask stage of an exposure apparatus and a resist film on the semiconductor device is transferred by exposure.

Comparative Example 1

[Manufacture of Mask Blank]

A mask blank of Comparative Example 1 was manufactured by the same procedure as Example 1, except for the hard mask film. The hard mask film of the Comparative Example 1 was formed without the second hard mask film 15 of Example 1, and with a film thickness of 12 nm with the same materials as those of the first hard mask film 14 ($SiO_2$ film Si:O=34 atom %, 66 atom %). The surface of the hard mask film was subjected to a HMDS (Hexamethyldisilazane) treatment, and a resist film of 40 nm was formed by the spin coating method.

[Manufacture of Transfer Mask (Phase Shift Mask)]

Next, using the mask blank of Comparative Example 1, manufacture of a half tone phase shift mask was attempted.

An electron beam writing was made on a resist film formed on the mask blank of Comparative Example 1 by the same procedure as that of Example 1. At this stage, a ground pin was in contact with a predetermined region where the hard mask film and the light shielding film of Comparative Example 1 are in contact with each other. However, charge-up occurred in the process of forming the resist pattern and a desired pattern could not be written.

Comparative Example 2

[Manufacture of Mask Blank]

A mask blank of Comparative Example 2 was manufactured by the same process as Example 1, except for the hard mask film. The change in the hard mask film of Comparative Example 2 compared to Example 1 is only the configuration of the second hard mask film 15. Specifically, the second hard mask film was formed with a film thickness of 3 nm under the same film forming condition as the light shielding film with a material consisting of chromium, oxygen, and carbon (CrOC film Cr:O:C=70.4 atom %:15.4 atom %:14.2 atom %). Next, a resist film of 40 nm was formed on the hard mask film by the spin coating method.

[Manufacture of Transfer Mask (Phase Shift Mask)]

Next, using the mask blank of Comparative Example 2, manufacture of a half tone phase shift mask was conducted. The process of manufacturing the phase shift mask is the same as the process explained in Example 1.

A ground pin was in contact with a predetermined region where the second hard mask film and the light shielding film of Comparative Example 2 are in contact with each other when an electron beam writing was made on the resist film formed on the mask blank of Comparative Example 2.

Thus, a phase shift mask of Comparative Example 2 was manufactured by the same procedure as that of Example 1.

Length measurement of the pattern was conducted on the phase shift mask of Comparative Example 2 mainly in the region where the SRAF pattern with 20 nm line width was formed, using a length measurement SEM (CD-SEM: Critical Dimension-Scanning Electron Microscope). As a result, several sections were found where the pattern itself was not formed in the main pattern for transfer or in the fine SRAF pattern of 20 nm line width. It is presumed that this situation was caused by the disappearing of the resist pattern before completion of pattern formation in the second hard mask film because of the slow etching rate of the second hard mask film during patterning the second hard mask film by dry etching with the resist pattern of 40 nm film thickness as a mask.

DESCRIPTION OF REFERENCE NUMERALS 1. substrate
2. light shielding film (thin film for pattern formation)
2b. light shielding film having second pattern (light shielding pattern)
3. first hard mask film 3a. first hard mask film having first pattern (first hard mask pattern)
4. second hard mask film
4a. second hard mask film having first pattern (second hard mask pattern)
4b. second hard mask film having second pattern (second hard mask pattern)
5. resist film
5a. resist film having first pattern (resist pattern)
6b. resist film having second pattern (resist pattern)
10. mask blank (binary mask blank)
11. substrate
12. phase shift film (thin film for pattern formation)
12a. phase shift mask having first pattern (phase shift pattern)
13. light shielding film (thin film for pattern formation)
13a. light shielding film having first pattern (light shielding pattern)
13c. light shielding film having third pattern (light shielding pattern)
14. first hard mask film
14a. first hard mask film having first pattern (first hard mask pattern)
15. second hard mask film
15a. second hard mask film having first pattern (second hard mask pattern)
15b. second hard mask film having second pattern (second hard mask pattern)
16. resist film
16a. resist film having first pattern (resist pattern)
17b. resist film having second pattern (resist pattern)
18c. resist film having third pattern (resist pattern)
20. mask blank (phase shift mask blank)
100. transfer mask (binary mask)
200. transfer mask (phase shift mask)

The invention claimed is:

1. A mask blank comprising a structure where a thin film for pattern formation, a first hard mask film, and a second hard mask film are stacked in this order on a main surface of a substrate,
    wherein the thin film for pattern formation contains a transition metal;
    wherein the first hard mask film contains oxygen and one or more elements selected from silicon and tantalum;
    wherein the second hard mask film contains a transition metal;
    wherein a content of transition metal of the second hard mask film is less than a content of transition metal of the thin film for pattern formation;
    wherein a region where the first hard mask film is formed on the main surface is smaller than a region where the thin film for pattern formation is formed; and
    wherein the second hard mask film and the thin film for pattern formation are in contact with each other at least in part.

2. The mask blank according to claim 1, wherein a total content of oxygen and nitrogen of the second hard mask film is greater than a total content of oxygen and nitrogen of the thin film for pattern formation.

3. The mask blank according to claim 2, wherein a region where the second hard mask film is formed on the main surface is greater than the region where the first hard mask film is formed.

4. The mask blank according to claim 3, wherein a difference between a content of transition metal of the thin film for pattern formation and a content of transition metal of the second hard mask film is 10atom % or more.

5. The mask blank according to claim 4, wherein a total content of oxygen and nitrogen of the second hard mask film is 30atom % or more.

6. The mask blank according to claim 1, wherein a region where the second hard mask film is formed on the main surface is greater than the region where the first hard mask film is formed.

7. The mask blank according to claim 1, wherein a difference between a content of transition metal of the thin film for pattern formation and a content of transition metal of the second hard mask film is 10atom % or more.

8. The mask blank according to claim 1, wherein a total content of oxygen and nitrogen of the second hard mask film is 30atom % or more.

9. The mask blank according to claim 1, wherein the second hard mask film has a film thickness of 5 nm or less.

10. The mask blank according to claim 1, wherein a total content of oxygen and nitrogen of the first hard mask film is 50atom % or more.

11. The mask blank according to claim 1, wherein an oxygen content of the first hard mask film is 50atom % or more.

12. The mask blank according to claim 1, wherein the first hard mask film has a film thickness of 7 nm or more.

13. The mask blank according to claim 1, wherein the thin film for pattern formation has a film thickness of 60 nm or less.

14. The mask blank according to claim 1, wherein the thin film for pattern formation is a light shielding film, and wherein a phase shift film is provided between the substrate and the light shielding film.

15. The mask blank according to claim 14, wherein the phase shift film contains silicon.

16. The mask blank according to claim 14, wherein the phase shift film has a function to transmit an exposure light at a transmittance of 1% or more, and a function to generate a phase difference of 150 degrees or more and 210 degrees or less between the exposure light transmitted through the phase shift film and the exposure light transmitted through the air for a same distance as a thickness of the phase shift film.

17. A method of manufacturing a transfer mask using the mask blank according to claim 14, comprising the steps of:
    forming a transfer pattern in the second hard mask film by dry etching using oxygen-containing chlorine-based gas with a resist film having a transfer pattern formed on the second hard mask film as a mask;
    forming a transfer pattern in the first hard mask film by dry etching using fluorine-based gas with a second hard mask film having the transfer pattern formed therein as a mask;
    forming a transfer pattern in the light shielding film by dry etching using oxygen-containing chlorine-based gas with a first hard mask film having the transfer pattern formed therein as a mask; and
    forming a transfer pattern in the phase shift film by dry etching using fluorine-based gas with a light shielding film having the transfer pattern formed therein as a mask.

18. A method of manufacturing a semiconductor device comprising the step of transferring a transfer pattern on a resist film on a semiconductor substrate by exposure using the transfer mask manufactured by the method of manufacturing a transfer mask according to claim 15.

19. A method of manufacturing a transfer mask using the mask blank according to claim 1, comprising the steps of:

forming a transfer pattern in the second hard mask film by dry etching using oxygen-containing chlorine-based gas with a resist film having a transfer pattern formed on the second hard mask film as a mask;

forming a transfer pattern in the first hard mask film by dry etching using fluorine-based gas with a second hard mask film having the transfer pattern formed therein as a mask; and forming a transfer pattern in the thin film for pattern formation by dry etching using oxygen-containing chlorine-based gas with a first hard mask film having the transfer pattern formed therein as a mask.

20. A method of manufacturing a semiconductor device comprising the step of transferring a transfer pattern on a resist film on a semiconductor substrate by exposure using the transfer mask manufactured by the method of manufacturing a transfer mask according to claim 19.

* * * * *